United States Patent [19]

Ogawa et al.

[11] Patent Number: 5,745,346
[45] Date of Patent: Apr. 28, 1998

[54] CONNECTING SOCKET FOR A SEMICONDUCTOR PACKAGE

[75] Inventors: Nobuyoshi Ogawa; Motoo Yonekubo, both of Nagano-ken, Japan

[73] Assignee: Shin-Etsu Polymer Co., Ltd., Tokyo, Japan

[21] Appl. No.: 649,123

[22] Filed: May 14, 1996

[30] Foreign Application Priority Data

Jun. 8, 1995 [JP] Japan .................................. 7-164504

[51] Int. Cl.$^6$ .................................................. H01L 27/00
[52] U.S. Cl. .................. 361/769; 361/767; 361/803; 361/820; 439/86; 439/91; 439/591
[58] Field of Search ................................ 361/769, 767, 361/771, 820, 803; 439/86, 91, 66, 69, 71, 72, 73, 591, 55

[56] References Cited

U.S. PATENT DOCUMENTS

| | | | |
|---|---|---|---|
| 4,766,371 | 8/1988 | Moriya | 324/158 |
| 5,104,327 | 4/1992 | Walburn | 439/71 |
| 5,140,405 | 8/1992 | King et al. | 357/67 |
| 5,163,837 | 11/1992 | Rowlette, Sr. | 439/91 |

*Primary Examiner*—Leo P. Picard
*Assistant Examiner*—David Foster
*Attorney, Agent, or Firm*—McAulay Fisher Nissen Goldberg & Kiel, LLP

[57] ABSTRACT

Proposed is a connecting socket used for electric connection between electrode terminals of a semiconductor package and electrode terminals of a circuit board by being interposed therebetween. The socket is an assembly consisting of a base body in the form of a frame made from an insulating material, in which a semiconductor package is put and secured in the position, and an anisotropically electroconductive elastic sheet member bonded to the bottom surface of the base body. When the socket holding the semiconductor package is mounted on a circuit board, electric conduction is established between the electrode terminals of the semiconductor package and the electrode terminals of the circuit board through the anisotropically electroconductive elastic sheet member.

4 Claims, 11 Drawing Sheets

CONNECTING SOCKET FOR A SEMICONDUCTOR PACKAGE

BACKGROUND OF THE INVENTION

The present invention relates to a connecting socket for a semiconductor package or, more particularly, to a connecting socket for a semiconductor package suitable for establishing an electric connection between an electronic circuit board and a surface-mountable semiconductor package.

It is conventional to use a so-called IC socket for the electric connection of a semiconductor package and a circuit board such as circuit boards for IC checkers and other electronic circuit boards. Such an IC socket of the type currently under wide applications consists of a base body provided with a mounting cavity having a spring means at the bottom for mounting of an IC package, in which the electrode terminals are installed as connected to the leads or pins fixed on the bottom or side surface of the base body with wiring. In the IC socket of this type, the leads on the base body are connected to the circuit board by means of soldering or handler or the pins on the bottom of the base body are connected to the circuit board by inserting the pins into the through-holes provided in the circuit board. The IC package is mounted in the mounting cavity and fixed therein resiliently by the spring means and the electrode terminals of the IC package are connected to the respective electrode terminals of the mounting cavity.

One of the problems in the IC socket of the above described type is that leads and pins must be provided outside of the base body necessarily requiring a large number of parts to be assembled with a large cost for labor. This problem is particularly serious due to the trend toward a finer and finer pitch of the electrode arrangement on semiconductor packages. Further, soldering to the circuit board is indispensable in this IC socket greatly decreasing the productivity of the assembling works for manufacture. When pins are provided, in particular, through-holes must be formed in the circuit board so that the design of the circuit board is necessarily complicated so much.

Further, it is indispensable in the IC socket of the above described type that a spring means is provided on the bottom of the mounting cavity in the base body so as to accomplish resilient stabilization of the connection between the electrode terminals of the semiconductor package and the electrode terminals of the circuit board resulting in an increased length of connection therebetween to cause degradation in the high-frequency characteristics.

SUMMARY OF THE INVENTION

The present invention accordingly has an object, in view of the above described problems in the conventional IC sockets, to provide an improved connecting socket for semiconductor packages which can be prepared from a relatively small number of parts and requiring no soldering to the circuit board in assemblage so as to enable a simple design of circuit boards along with good high-frequency characteristics of the semiconductor devices.

Thus, the connecting socket for a semiconductor package provided by the invention is an assembly of parts which comprises:

(a) a base body in the form of a frame having a mounting opening penetrating from the top surface to the bottom surface thereof for mounting of a semiconductor package;

(b) an anisotropically electroconductive sheet member having elasticity and electroconductivity in the direction of thickness and bonded onto the bottom surface of the base body in such a fashion that at least a part thereof appears in the mounting opening of the base body so as to come into contact with the electrode terminals of a circuit board when the socket is mounted on the circuit board and to come into press-contact with the electrode terminals of the semiconductor package when the semiconductor package is put into the mounting opening of the base body; and, optionally, (c) a positioning means which is engageable with a circuit board so as to effect exact positioning of the base body relative to the circuit board.

DETAILED DESCRIPTION OF THE PREFERRED EMBODIMENTS

In the following, several embodiments of the inventive connecting socket for a semiconductor package are described in more detail by making reference to the accompanying drawing.

Figure 1:
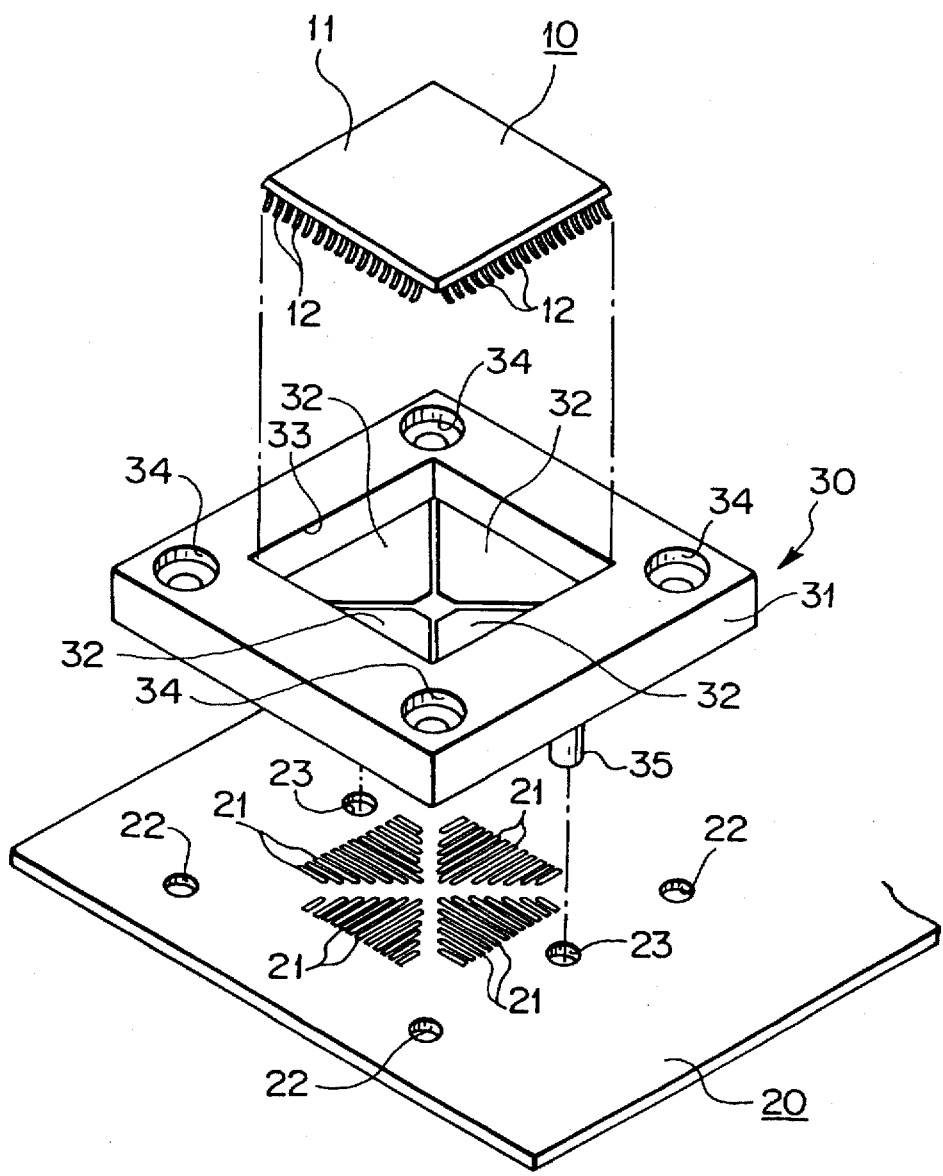
FIG. 1 is a perspective view of the inventive connecting socket according to a first embodiment of the invention. A circuit board and a semiconductor package to be connected with the socket are added.
Figure 2:
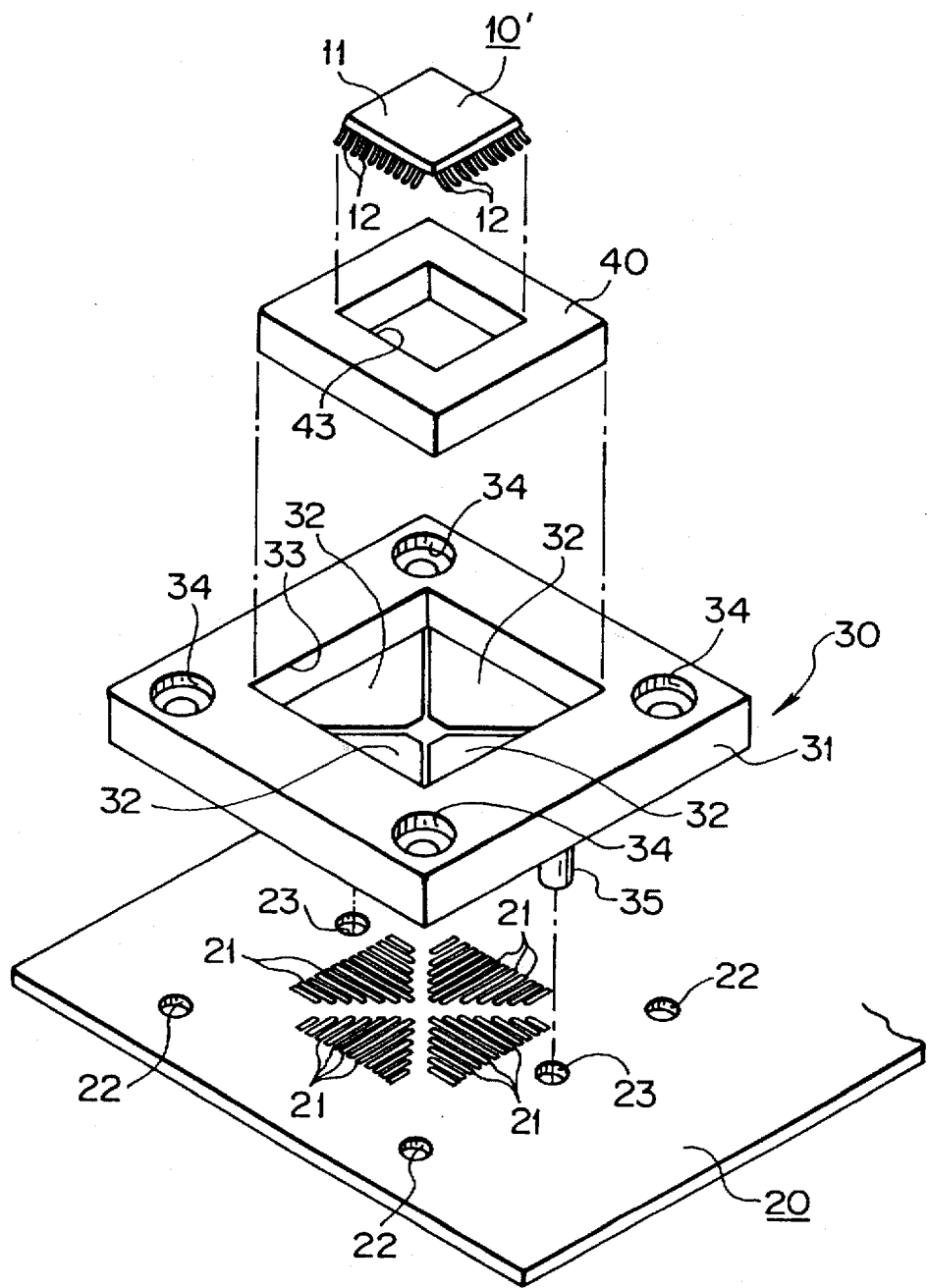
FIG. 2 is a perspective view of the inventive connecting socket according to the first embodiment of the invention with an adapter frame. A circuit board and a semiconductor package, which is smaller than that in FIG. 1, to be connected with the socket are added.
Figure 3:
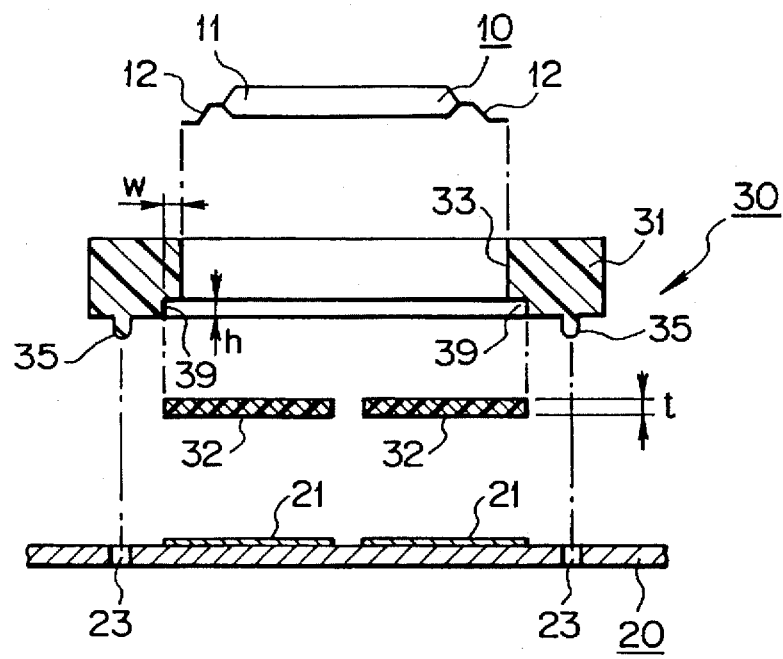
FIG. 3 is a vertical cross sectional view of the inventive connecting socket according to the first embodiment of the invention as disassembled into parts. A circuit board and a semiconductor package to be connected with the socket are added.
Figure 4:
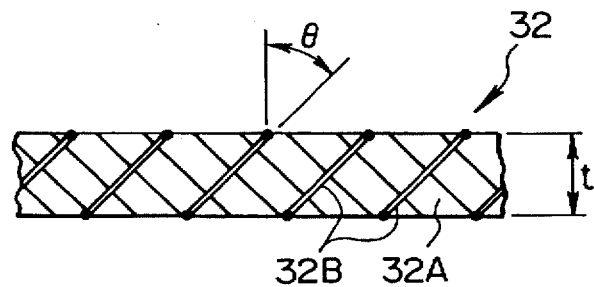
FIG. 4 is an enlarged partial vertical cross sectional view of the anisotropically electroconductive sheet member in the inventive connecting socket.

FIGS. 1 to 3 each illustrate the connecting socket according to the first embodiment, of which FIG. 1 is a perspective view, FIG. 2 is a perspective view with addition of an adapter frame for a semiconductor package of smaller dimensions and FIG. 3 is a vertical cross sectional view of the socket as disassembled into parts. FIG. 4 is an enlarged partial vertical cross sectional view of the anisotropically electroconductive sheet member used in each embodiment described below.

The connecting socket 30 is used as interposed between a semiconductor package 10 of the QFP (quad flat pack) type and a circuit board 20. When a smaller semiconductor package 10' is to be connected by using the same connecting socket 30, an adapter frame 40 is inserted into the mounting opening 33 of the connecting socket 30 as is illustrated in FIG. 2 so that the connecting sockets having identical dimensions can be used for various semiconductor packages of different sizes only by preparing adapter frames of the sizes to comply with the dimensions of the respective semiconductor packages.

As is conventional, a semiconductor package 10 or 10' has a configuration consisting of a body 11 in the form of a square or rectangular and flat plate provided along the four sides thereof each with an array of a plural number of leads or electrode terminals 12 at a regular pitch. The circuit board 20, on the other hand, is provided, for example, by pattern printing, with a set of electrode terminals 21 in diagonally divided four groups on the sector areas which come inside of the mounting opening 33 in the connecting socket 30 when the socket 30 is mounted on the circuit board 20. The electrode terminals 21 each have a different length from the other terminals to be arranged in a quasi-triangular pattern for each of the groups as is illustrated in FIGS. 1 and 2. The connecting socket 30 can be mounted in an accurate position on the circuit board 20 by engagement of the positioning holes 23 with the positioning pins 35 extending downwardly on the lower surface of the socket 30. The connecting socket 30 and the circuit board 20 are fixedly connected by a suitable means such as bolts and nuts (not shown in the figures) having a bolt penetrating through the opening 34 in the socket 30 and 22 in the circuit board 20 fastened by screwing a nut into the bolt.

The base body 31 of the connecting socket 30 is made from an electrically insulating resin and is provided with a mounting opening 33 so as to have a configuration something like a frame board. Examples of the above mentioned insulating resin for the base body 31 of the socket 30 include epoxy resins, acrylic resins, polyester resins, polyphenylene sulfide resins and polyether sulfone resins though not particularly limitative thereto. The base body 31 is prepared from these resins by the method of injection molding or by machining from a larger block of the resin. The mounting opening 33 in the base body 31 of the socket 30 has such a dimension as to be slightly larger than the dimension to just fit the semiconductor package 10 to be put thereinto including the leads 12 protruded out of the peripheries of the base 11 to define an envelope line. In other words, the semiconductor package 10 can be freely mounted onto and demounted from the mounting opening 33 and, when the semiconductor package 10 is put into the mounting opening 33, the end points of the electrode terminals 12 in the semiconductor package 10 are brought into contact with the inside walls of the mounting opening 33. The bottom surface of the base body 31 of the socket 30 is provided, as is illustrated in FIG. 3, with a stepped recess 39.

Four anisotropically electroconductive sheet members 32 each having a quasi-triangular form are adhesively bonded to the surface of the stepped recess 39 on the bottom surface of the base body 31 in such a fashion that one of the corners, which may be rounded or flattened as is illustrated in FIGS. 1 and 2, is protruded in the mounting opening 33 of the base body 31 so that the mounting opening 33 is approximately fully filled with the protruded portions of the four sheet members 32 leaving narrow linear spaces between adjacent sheet members 32 and the center portion. It is important that the depth h (see FIG. 3) of the recess 39 does not exceed the thickness of the anisotropically electroconductive sheet members 32 but not smaller by more than approximately 0.2 mm. The width w of the stepped recess 39 is, though not particularly limitative, in the range from 2 mm to 5 mm in order to ensure reliability of the adhesive bonding of the sheet members 32 to the base body 31. The adhesive used to effect adhesive bonding between the base body 31 and the anisotropically electroconductive sheet members 32 is not particularly limitative provided that the adhesive has no corrosiveness against the base body 31 and the sheet member 32 and, desirably, can be dried or cured quickly from the standpoint of working efficiency. Examples of suitable adhesives include acrylic adhesives, cyano-based adhesives and cyanoacrylate-based adhesives.

Though not shown in the figures, it is a possible and sometimes advantageous way that a covering is provided on the top surface of the base body 31 in a pivotally rotatable fashion to be put over and removed from the mounting opening 33 so that the semiconductor package 10 put into the mounting opening 33 is pressed down by the covering put over the mounting opening 33 to give a downward pressing force to the semiconductor package 10 to increase reliableness of contacting between the electrode terminals 12 and the anisotropically electroconductive sheet members 32. It is preferable to provide a spring means on the lower surface of the covering so that the semiconductor package 10 can be secured in the mounting opening 33 at a correct position under elastic resilience.

The anisotropically electroconductive sheet member 32 has rubbery elasticity and electroconductivity only in the direction of the thickness or, i.e. the direction connecting the flat surfaces. Such a sheet material per se is well known in the art and consists of an insulating rubbery material 32A as the matrix phase and a multiplicity of fine electroconductive linear or filamentous bodies, e.g., fine metal wires and carbon fibers, 32B embedded in the matrix phase 32A in such a fashion that each of the linear bodies 32B runs in parallel to the others and the two ends thereof appear on one and the other surfaces of the sheet member so that the sheet member 32 is electroconductive only in the direction of the thickness but insulating within the surface plane of the sheet member 32. It is preferable that the running direction of the electroconductive linear bodies 32B in the sheet member 32 is not just perpendicular to the surface of the sheet member 32 but makes an angle θ, which is 5° or larger, with the surface in order to prevent buckling of the linear bodies 32B under compression of the sheet member 32 or to facilitate compressive deformation of the sheet member 32 under a relatively small pressing force thereon. The distribution density of the electroconductive linear bodies 32B in the matrix phase 32A is, though not necessarily uniform over the whole area of the sheet member 32 but optionally modified from spot to spot, is usually at least 100 per $mm^2$ so that, assuming that an electrode terminal 12 has a contacting area of 0.03 $mm^2$, electric connection for an electrode terminal 12 can be established with at least three electroconductive linear bodies 32B. Such an anisotropically electroconductive sheet material can be prepared according to a known method disclosed, for example, in Japanese Patent Kokai No. 62-51848.

It is preferable that the rubbery matrix 32A of the anisotropically electroconductive sheet member 32 has a Shore A hardness in the range from 20° H to 60° H in order to obtain good balance between reliability in the resilient support of the semiconductor package 10 thereon and the elastic deformability or, more preferably, in the range from 30° H to 60° H in consideration of the durability in the prolonged or repeated use of the socket 30 without the problem of the phenomenon of fatigue. Various synthetic rubbers meet this requirement including, for example, styrene-butadiene copolymeric rubbers, acrylonitrile-butadiene copolymeric rubbers, polybutadiene rubbers, polyisoprene rubbers, polychloroprene rubbers, ethylene-propylene copolymeric rubbers, butyl rubbers, silicone rubbers, fluorocarbon rubbers, urethane rubbers, acrylic rubbers and the like among the styrene-based rubbers, olefin-based rubbers and urethane-based rubbers as well as ester-based thermoplastic elastomers.

The electroconductive linear body 32B is typically a fine wire of a metal or alloy such as nickel, gold, silver, copper, tungsten, copper-based alloys, tin-based alloys and the like. Fine wires of copper or a copper-based alloy plated, preferably by an electrolytic method, with gold or double-plated with nickel and gold in a plating thickness of 0.1 µm to 0.5 µm can be used satisfactorily in respect of the increased electroconductivity and resistance against corrosion. The diameter of these fine wires is preferably in the range from 10 to 50 µm.

Following is a description of an example of the method for the preparation of the anisotropically electroconductive sheet member 32. In the first place, a rubbery material before curing, such as a silicone rubber composition, is subjected to sheeting to give thin sheets having a thickness of, for example, 0.03 mm. Thereafter, the fine metal wires 32B are arranged in alignment each in parallel to the others at a specified pitch of, for example, 0.1 mm in a fashion something like a reed screen followed by overlaying of another rubber sheet to form a three layered stack which is subjected to a curing treatment of the rubber to give a cured silicone rubber sheet having a thickness of, for example, 0.06 mm embedding an aligned array of the fine metal wires. A plurality of such cured rubber sheets are then stacked one on the other and bonded together by using an adhesive such as a liquid silicone rubber composition to form a block of a suitable height of, for example, 50 mm, in which all of the fine metal wires 32B run in one and the same direction, followed by a curing treatment of the adhesive. The thus obtained block is sliced in a plane perpendicular to the running direction of the fine metal wires or, preferably, in a plane making a small angle θ therewith to give anisotropically electroconductive sheets having a desired thickness of, for example, 1 mm. The dimensions above are given merely for the purpose of illustration and a distribution density of the fine metal wires 32B in the matrix phase 32A of 100 per $mm^2$ can be easily obtained by adequately selecting these dimensions.

The anisotropically electroconductive sheet prepared in the above described manner is then cut into the form of a quasi-triangle and four of the quasi-triangular sheets 32 are each adhesively bonded at one side to one of the four sides of the stepped recess 39 surrounding the mounting opening 33 of the base body 31. As is illustrated in FIGS. 1 and 2, these four quasi-triangular sheet members 32 together make an approximate square filling the mounting opening 33 of the base body 31 leaving a narrow gap between adjacent sheet members 32. When the connector socket 30 is mounted on the circuit board 20 with exact positioning and a semiconductor package 10 is put into the mounting opening 33 of the socket 30, the end points of the leads 12 of the semiconductor package 10 come into contact with one of the anisotropically electroconductive sheet members 32 which in turn is in contact with the electrode terminals 21 of the circuit board 20 on the lower surface so as to establish electric conduction between particular one of the leads 12 of the semiconductor package 10 and particular one of the electrode terminals 21 on the circuit board 20.

When the semiconductor package 10' has a size smaller than the mounting opening 33 of the socket 30 and cannot be secured in the position by merely putting the package 10' into the mounting opening 33, it is a convenient way that, as is illustrated in FIG. 2, an adapter frame 40, which has an outer dimension to just fit the mounting opening 33 of the socket 30 and an opening 43 having dimensions to fit the semiconductor package 10', is first mounted on the mounting opening 33 of the socket 30 and the semiconductor package 10' is put into the opening 43 of the adapter frame 40 to be secured at an accurate position. When several adapter frames 40 having a mounting opening 43 of different dimensions are prepared, accordingly, connecting sockets 30 of a single dimension of the mounting opening 33 may serve for different semiconductor packages so that the costs for the preparation of sockets of different dimensions can be saved.

In the embodiment illustrated in FIG. 1 or FIG. 2, the socket 30 and the circuit board 20 are connected together by means of a set of bolts and nuts (not shown in the figures) or by other means utilizing the openings 34 and 22 with exact positioning by the engagement of the positioning pins 35 on the lower surface of the base body 31 of the socket 30 with the respective positioning openings or cavities 23 on the circuit board 20. When the semiconductor package 10 or 10' is mounted on the mounting opening 33 of the base body 31, the leads 12 on the body 11 of the package 10 extending aside downwardly come into contact with the anisotropically electroconductive sheet members 32 which in turn are in contact with the assemblies of the electrode terminals 21 on the circuit board 20 so that electric conduction is established between one of the leads 12 and one of the electrode terminals 21 through the electroconductive filamentous bodies 32B illustrated in FIG. 4.

To give a more detailed explanation, the insulating rubbery matrix 32A of the anisotropically electroconductive sheet member 32 sandwiched between the package 10 and the circuit board 20 with an appropriate contacting or fastening pressure is resiliently compressed so that each of the end points of the electroconductive filamentous body 32B embedded in the matrix 32A come into contact with one of the leads 12 of the package 10 at one end and with one of the electrode terminals 21 on the circuit board 20 at the other end to establish electric connection therebetween. Therefore, not only the structure of the connecting socket 30 is very simple as compared with conventional connecting sockets in respect of the absence of any terminals but also the assembling work of the package 10 and the circuit board 20 can be greatly simplified without necessitating any soldering works.

Figure 5:
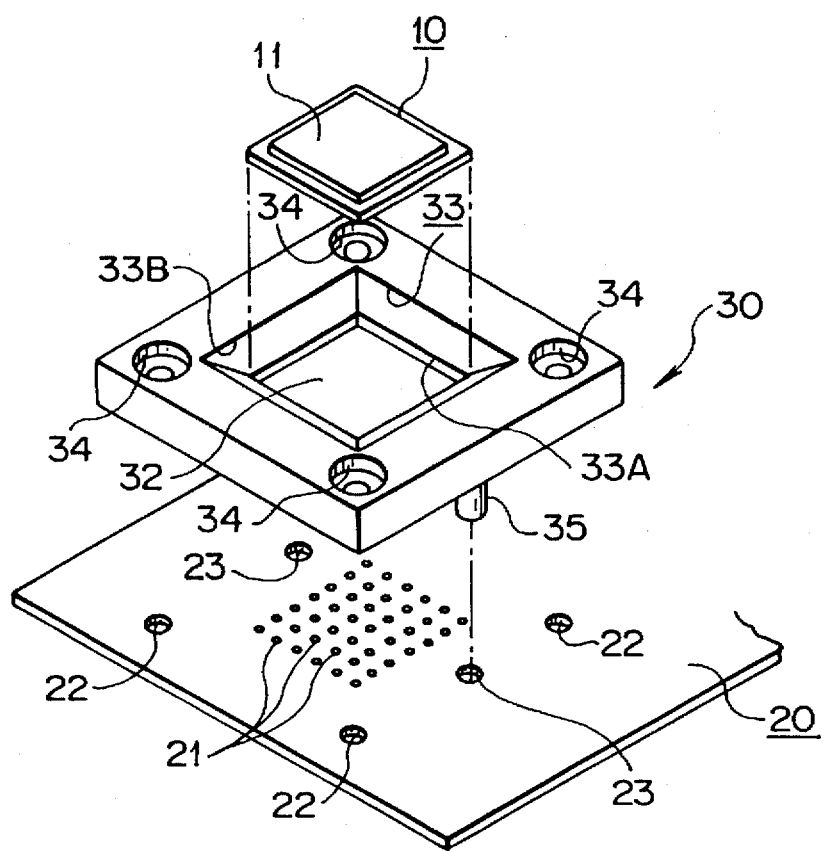
FIGS. 5 and 6 are a perspective view and a vertical cross sectional view, respectively, of the inventive connecting socket according to a second embodiment of the invention. A circuit board and a semiconductor package to be connected with the socket are added in each figure.
Figure 6:
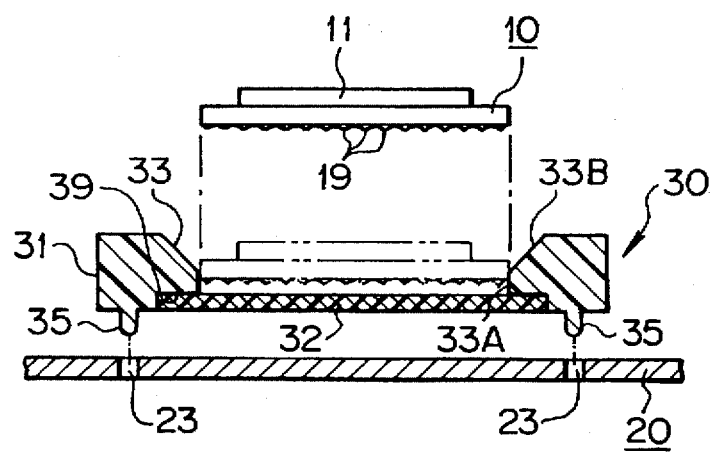

FIGS. 5 and 6 each illustrate a perspective view and a vertical cross sectional view, respectively, of a second embodiment of the inventive connecting socket 30 with addition of a semiconductor package 10 and a circuit board 20. Different from the semiconductor package 10 illustrated in FIGS. 1 and 2, of which the electrode terminals or leads 12 extend aside downwardly, the package 10 here, to which the second embodiment of the inventive socket 30 can be successfully applied, is of the so-called BGA (ball-grit array)

type, in which a plurality of electrode terminals 19 each in the form of a boss or rivet head are distributed on the bottom surface of the body 11 in an appropriate down-and-across arrangement.

Corresponding to this BGA electrode terminals 19 on the semiconductor package 10, the circuit board 20 also has electrode terminals 21 arranged in the same arrangement as the BGA terminals 19 on the package 10. In place of the four sectored anisotropically electroconductive sheet members 32 in the embodiment illustrated in FIG. 1 or 2, the socket 30 in this case has a single anisotropically electroconductive sheet member 32 in a square form, which is adhesively bonded to the stepwise recessed surface 39 of the base body 31. The base body 31 of the socket 30 per se is not particularly different from that illustrated in FIGS. 1 and 2 except that, though optional, the inside walls of the mounting opening 33 consist of the guide slopes 33B and the straightly vertical areas 33A to serve as a positioning means. It is important that the mounting opening 33 of the socket 30 has such dimensions that the semiconductor package 10 having no electrode terminals extending aside downwardly can fit the mounting opening 33 as exactly as possible without play so as to ensure a high efficiency of the assembling works of the package 10 and circuit board 20 by an automatized means.

Figure 7:
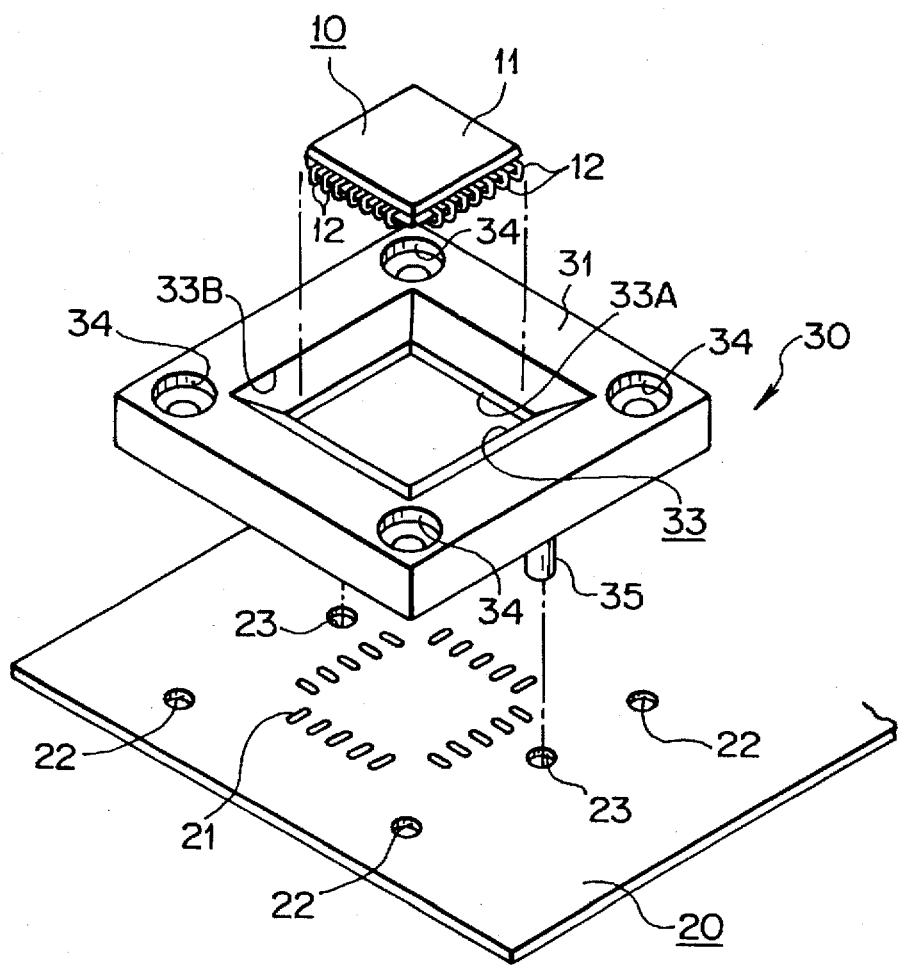
FIGS. 7 and 8 are a perspective view and a vertical cross sectional view, respectively, of the inventive connecting socket according to a third embodiment of the invention. A circuit board and a semiconductor package to be connected with the socket are added in each figure.
Figure 8:
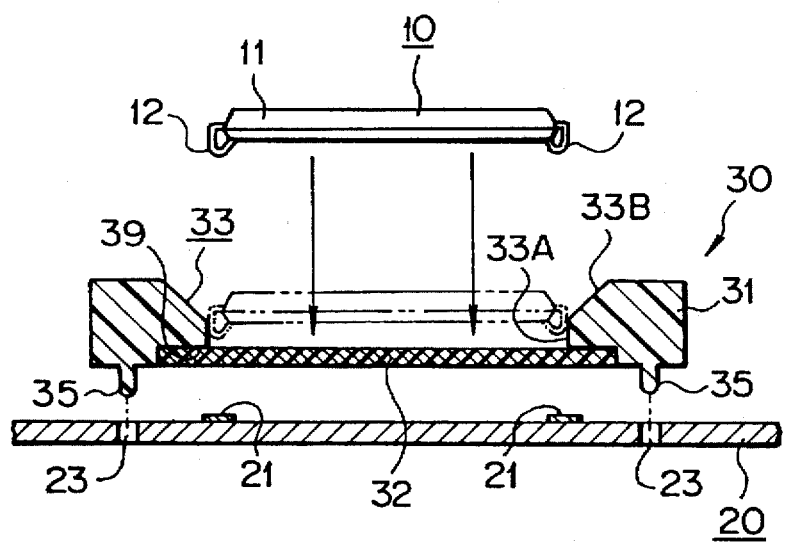

FIGS. 7 and 8 illustrate a different application of the same socket 30 in the above described second embodiment by a perspective view and by a vertical cross sectional view, respectively, each with addition of a semiconductor package 10 and a circuit board 20. Different from the application illustrated in FIGS. 5 and 6, the semiconductor package 10 has, in place of the BGA electrode terminals 19 on the bottom surface of the body 11 of the package 10, electrode terminals 12 extending aside downwardly similar to those in the package 10 illustrated in FIGS. 1 and 2 but in the form of the so-called J-wise bent PLCC (plastic-leaded chip carrier) terminals. Further differently from the circuit board 20 illustrated in FIGS. 1 and 2, the arrangement of the electrode terminals 21 on the circuit board 20 here is not in the four-sectored areas but the terminals 21 are arranged along a square line encircling the contour of the package 10 so as to be just opposite with the electrode terminals 12 of the package 10 when the package 10 and the circuit board 20 are assembled with intervention of the socket 30.

Figure 9:
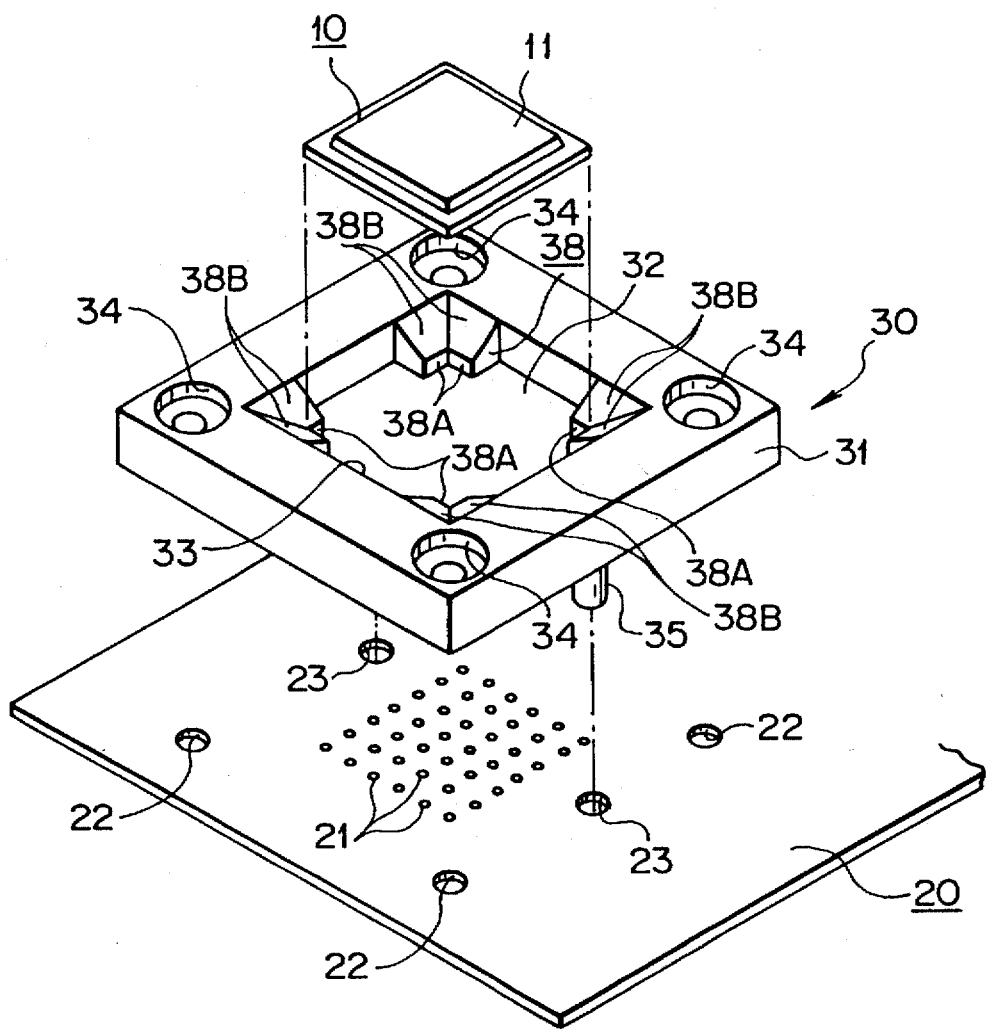
FIG. 9 is a perspective view of the inventive connecting socket according to a fourth embodiment of the invention. A circuit board and a semiconductor package to be connected with the socket are added.

FIG. 9 is a perspective view illustrating a modification of the socket 30 shown in FIGS. 5 and 6. While the socket 30 illustrated in FIGS. 5 and 6 has a square mounting opening 33, the base body 31 in this modified embodiment has four protrusions 38 at the respective corners of the mounting opening 33, each protrusion having guide slopes 38B and straightly vertical areas 38A which serve as a positioning guide for the package 10 put into the mounting opening 33 by coming into contact with the corner portions of the package 10. The anisotropically electroconductive sheet member 32 can be adhesively bonded to the bottom surfaces of the corner protrusions 38 so as to increase the reliableness of adhesive bonding between the sheet member 32 and the base body 31 of the socket 30.

Figure 10:
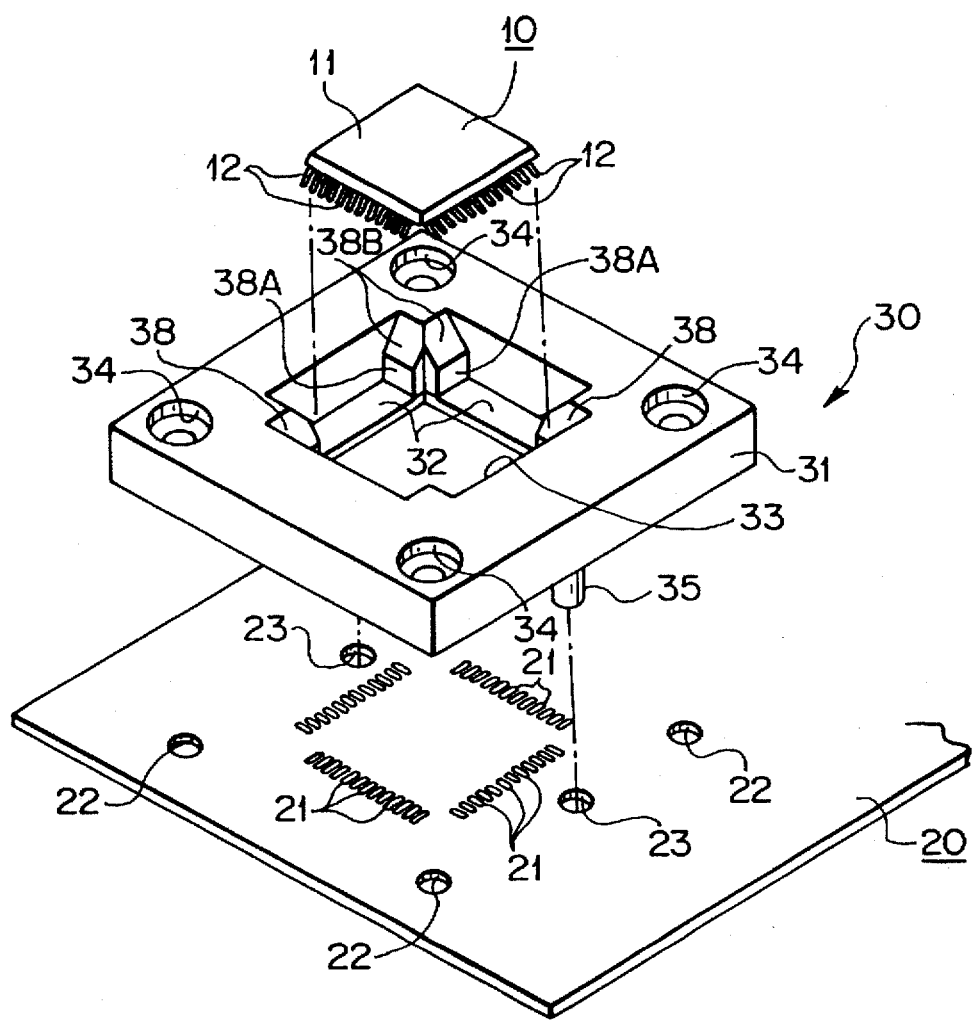
FIG. 10 is a perspective view of the inventive connecting socket according to a fifth embodiment of the invention. A circuit board and a semiconductor package to be connected with the socket are added.
Figure 11:
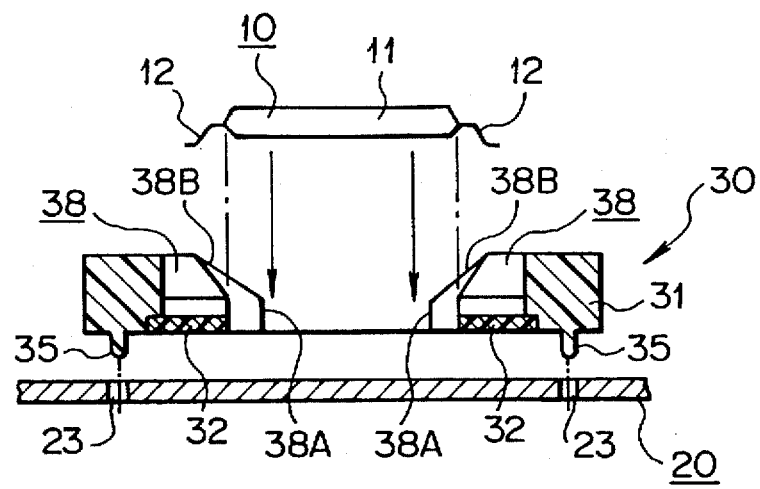
FIGS. 11 and 12 are a vertical cross cross sectional view and a plan view, respectively, of the inventive connecting socket according to a sixth embodiment of the invention. A circuit board and a semiconductor package to be connected with the socket are added in each figure.
Figure 12:
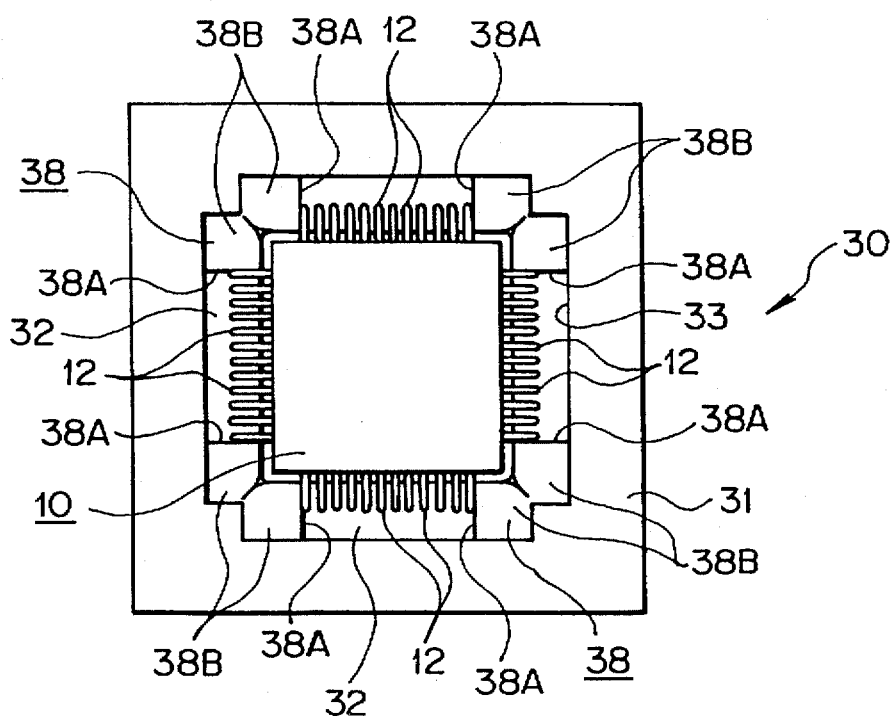

FIGS. 10, 11 and 12 are given to illustrate a further different embodiment of the inventive connecting socket and an application thereof, of which FIGS. 10 and 11 are a perspective view and a vertical cross sectional view, respectively, each with addition of a semiconductor package 10 and a circuit board 20 and FIG. 12 is a plan view of an assembly of the connecting socket sandwiched between a semiconductor package 10 and a circuit board 20. Similarly to the embodiment illustrated in FIG. 9, the base body 31 of the socket 30 has four corner protrusions 38 each having guide slopes 38B and vertical positioning surfaces 38A. Instead of the anisotropically electroconductive sheet member 32 in the form of a single square sheet in the embodiment illustrated in FIG. 9, the socket 30 illustrated in FIG. 10 has four anisotropically electroconductive sheet members 32 each in the form of a narrow strip adhesively bonded to the bottom surfaces of two adjacent corner protrusions 38 along the inside wall surfaces of the base body 31. This arrangement of the anisotropically electroconductive sheet members 32 is quite satisfactory when the electrode terminals 21 on the circuit board 20 are arranged in four rows each along one of the four sides of a square or rectangle as is illustrated in FIG. 10.

Figure 13:
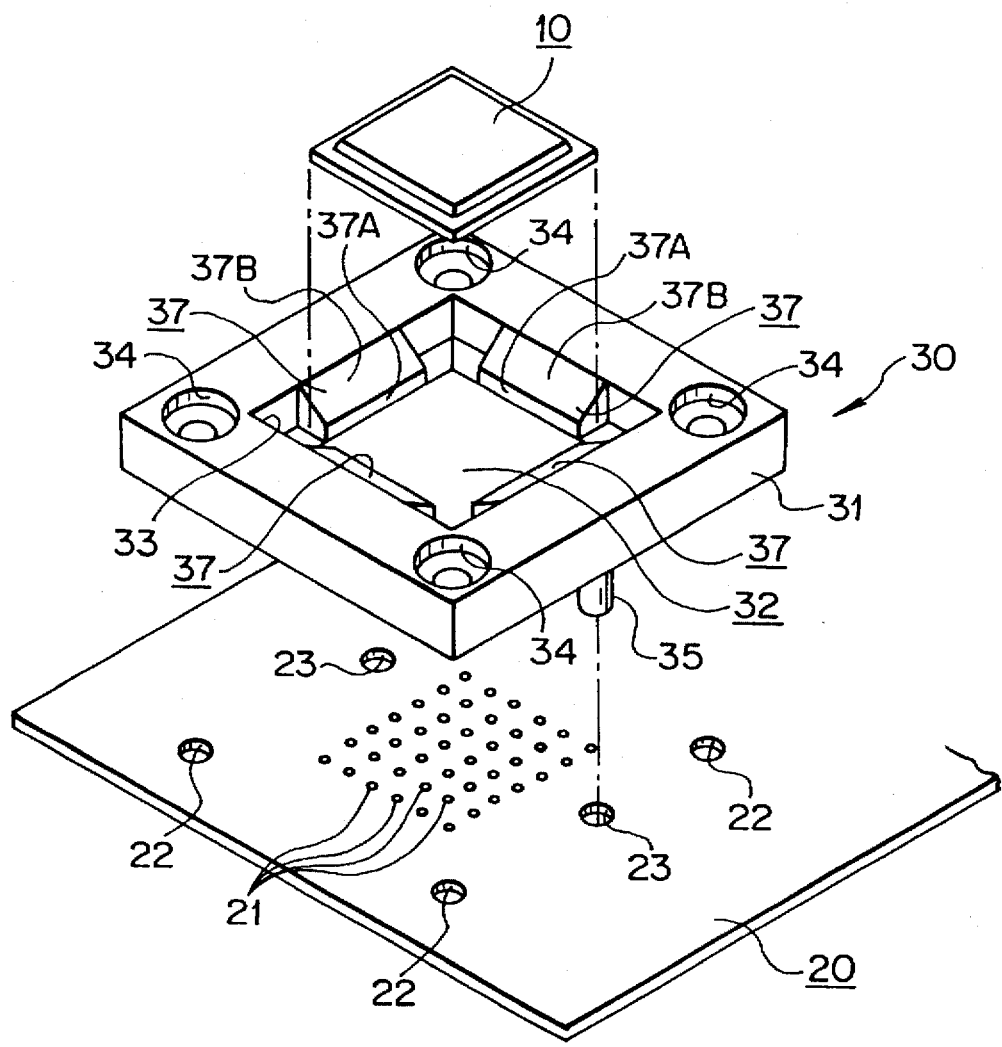
FIG. 13 is a perspective view of the inventive connecting socket according to a seventh embodiment of the invention. A circuit board and a semiconductor package to be connected with the socket are added.

FIG. 13 is a perspective view illustrating a still different embodiment of the inventive connecting socket 30 which has, instead of the four corner protrusions 38 shown in FIG. 9, four side protrusions 37 each on one of the inside walls of the mounting opening 33. Each side protrusion has a guide slope 37B and positioning surface 37A. The anisotropically electroconductive sheet member 32 is in the form of a square sheet and adhesively bonded to the bottom surfaces of the four side protrusions 37.

Though not shown in the figures, it is optional that the base body 31 of the socket 30 is further provided with a means for press-contacting of the electroconductive terminals or leads 12 or 19 of the semiconductor package 10 to the anisotropically electroconductive sheet member or members 32 and the electrode terminals 21 of the circuit board 20 to the anisotropically electroconductive sheet member or members 32 so as to enhance reliableness of electric conduction to be established between the terminals 12 or 19 and the terminals 21 through the anisotropically electroconductive sheet member or members 32.

What is claimed is:

1. A connecting socket for a semiconductor package and a circuit board which comprises, as an assembly:

a) a base body made from an electrically insulating material in the form of a frame having a mounting opening penetrating from the top surface to the bottom surface thereof for mounting of a semiconductor package; and b) an anisotropically electroconductive sheet member having elasticity and electroconductivity in the direction of thickness and bonded onto the bottom surface of the base body in such a fashion that at least a part thereof appears in the mounting opening of the base body so as to come into contact with the electrode terminals of a circuit board when the socket is mounted on the circuit board and to come into contact with the electrode terminals of a semiconductor package when the semiconductor package is put into the mounting opening of the base body, wherein the mounting opening is in a square or rectangular form and the anisotropically electroconductive sheet member is divided into four quasi-triangular pieces. each of which is bonded to the bottom surface of the base body along the periphery of one of the inside walls of the mounting opening to be protruded into the mounting opening.

2. The connecting socket as claimed in claim 1 in which the anisotropically electroconductive sheet member is in the form of a single square or rectangular sheet capable of covering the whole mounting opening.

3. The connecting socket as claimed in claim 1 in which the anisotropically electroconductive sheet member is a composite body consisting of an electrically insulating rubbery elastomer to form a matrix phase and a multiplicity of electroconductive linear bodies embedded in the matrix each in parallel with the others and penetrating the matrix from one flat surface to the other.

4. The connecting socket as claimed in claim 1 in which the inside wall facing the mounting opening has a sloped guide surface and a positioning surface for positioning of the semiconductor package put into the mounting opening.

* * * * *